(12) United States Patent
Suzuki et al.

(10) Patent No.: US 6,447,934 B1
(45) Date of Patent: Sep. 10, 2002

(54) ORGANIC ELECTROLUMINESCENT PANEL

(75) Inventors: Harumi Suzuki, Kariya (JP); Takeshi Ishikawa, Nishikasugai-gun (JP); Junji Kido, 9-4-3, Umami-kita, Koryo-cho, Kitakatsuragi-gun, Nara-ken, 635-0831 (JP)

(73) Assignees: Denso Corporation, Kariya (JP); Junji Kido, Nara Ken (JP)

( * ) Notice: Subject to any disclaimer, the term of this patent is extended or adjusted under 35 U.S.C. 154(b) by 0 days.

(21) Appl. No.: 09/414,823

(22) Filed: Oct. 8, 1999

(30) Foreign Application Priority Data

Oct. 9, 1998 (JP) .......................... 10-288185
Aug. 31, 1999 (JP) .......................... 11-245939

(51) Int. Cl.$^7$ .............................. H05B 33/14
(52) U.S. Cl. .................. 428/690; 428/917; 428/704; 428/212; 313/504; 313/506; 257/40; 257/103
(58) Field of Search .................. 428/917, 690, 428/704, 212; 313/504, 506; 257/40, 103

(56) References Cited

U.S. PATENT DOCUMENTS

| 5,093,698 A | | 3/1992 | Egusa |
| 5,294,810 A | | 3/1994 | Egusa et al. |
| 5,343,050 A | | 8/1994 | Egusa et al. |
| 5,601,903 A | | 2/1997 | Fujii et al. |
| 5,668,438 A | * | 9/1997 | Shi et al. ............. 313/540 |
| 5,837,391 A | * | 11/1998 | Utsugi ............. 428/690 |
| 5,858,562 A | * | 1/1999 | Utsugi et al. ............. 428/690 |
| 5,908,581 A | * | 6/1999 | Chen et al. ............. 252/301.16 |
| 6,124,046 A | * | 9/2000 | Jin et al. ............. 428/690 |

FOREIGN PATENT DOCUMENTS

| JP | 6-158038 | 6/1994 |
| JP | 6207170 | 7/1994 |
| JP | 7142169 | 6/1995 |
| JP | 8-78163 | 3/1996 |
| JP | 103990 | 1/1998 |
| WO | WO94/06157 | 3/1994 |

OTHER PUBLICATIONS

"Organic El Display" (an extra issue of monthly magazine "Display"), issued on Oct. 10, 1998.

Transactions of 6th FPD Seminar, sponsored by Electonic Journal, held on Jun. 29, 1999.

* cited by examiner

Primary Examiner—Cynthia H. Kelly
Assistant Examiner—Ling Xu
(74) Attorney, Agent, or Firm—Pillsbury Winthrop

(57) ABSTRACT

An organic electroluminescent panel having two luminescent layers interposed between a pair of electrode layers emits white light or colored light. One luminescent layer is composed of a hole transport host material and a first fluorescent material doped in the host material, and the other luminescent layer is composed of an electron transport host material and a second fluorescent material doped in the host material. Both luminescent layers simultaneously emit respective lights which in turn are mixed into a white light or colored light. To realize the simultaneous light emission from both luminescent layers and to enhance energy conversion efficiency, organic materials having a solid state fluorescence spectrum peak wavelength in a range of 380 nm–510 nm are used as both host materials, and materials having a solid state fluorescence spectrum which overlaps with that of the host materials or is shifted to a longer wavelength side are used as the fluorescent materials doped in the host materials. The light color emitted from the panel is arbitrarily controlled by selecting the fluorescent dopant materials.

8 Claims, 9 Drawing Sheets

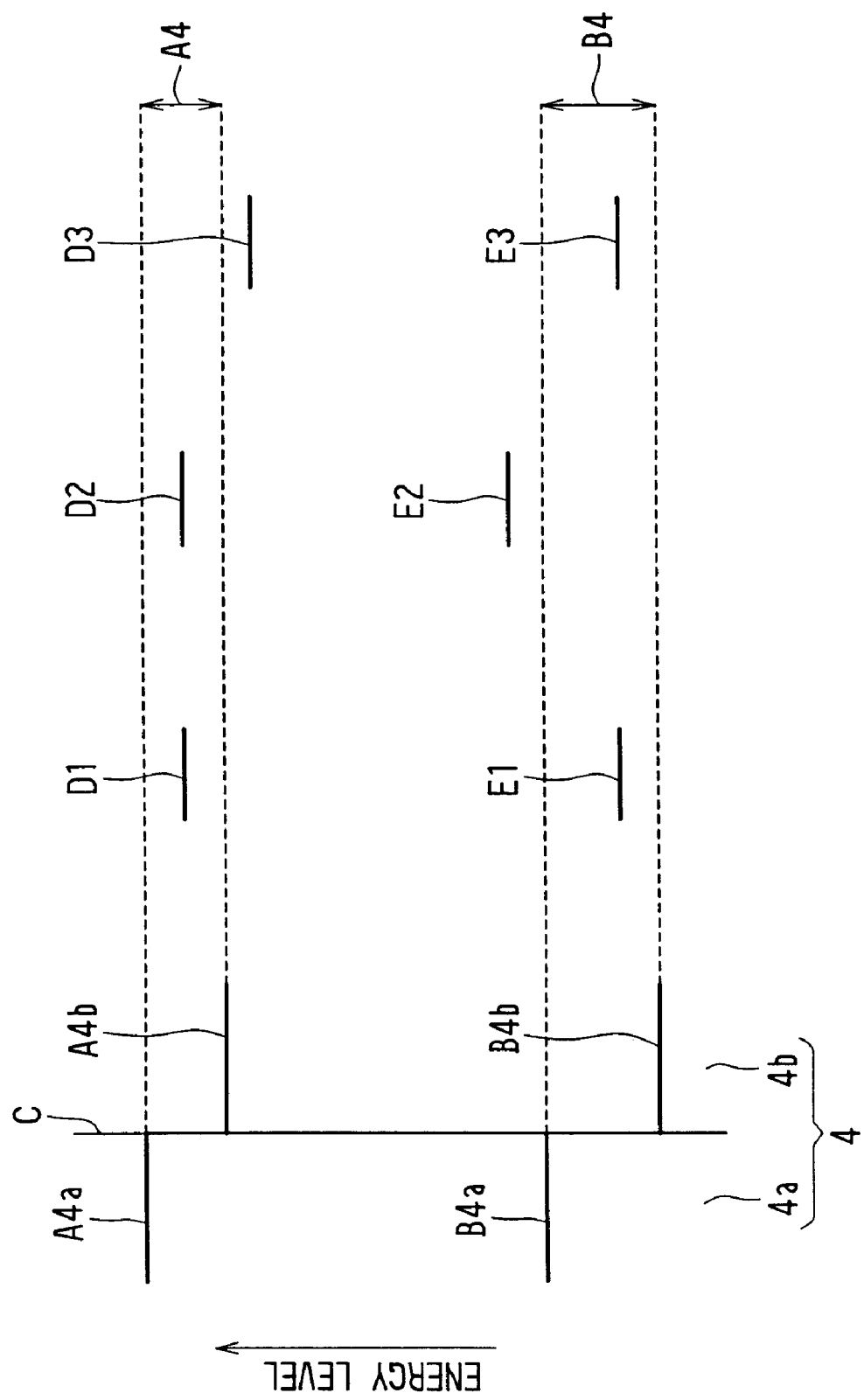

DCJTB SKELETON

ORGANIC ELECTROLUMINESCENT PANEL

CROSS-REFERENCE TO RELATED APPLICATIONS

This application is based upon and claims benefit of priority of Japanese Patent Applications No. Hei-10-288185 filed on Oct. 9, 1998 and No. Hei-11-245939, filed on Aug. 31, 1999, the contents of which are incorporated herein by reference.

BACKGROUND OF THE INVENTION

1. Field of the Invention

The present invention relates to an electroluminescent panel that has a luminescent layer made of organic chemical compounds sandwiched between a pair of electrodes and emits multi-color light.

2. Description of Related Art

An example of organic electroluminescent panels emitting multi-color light is disclosed in JP-A-8-78163. This panel includes a hole transport luminescent layer and an electron transport luminescent layer, both luminescent layers being laminated with a carrier re-combination control layer interposed therebetween. Both luminescent layers simultaneously emit respective colored lights that are combined into a white light when they are emitted from the panel. The hole transport luminescent layer is composed of a hole transport material as a host material and a fluorescent material as a dopant. Similarly, the electron transport luminescent layer is composed of an electron transport material as a host material and a fluorescent material as a dopant. Both the host and dopant materials show fluorescence property in their solid state.

In this electroluminescent panel, positive holes are injected into the hole transport luminescent layer and electrons are injected into the electron transport luminescent layer from the pair of electrodes composed of an anode and a cathode. The injected holes and electrons re-combine in the luminescent layers through the carrier re-combination control layer, thereby generating excitons. The excitons transfers energy to the host materials and/or fluorescent dopants, and thereby light is emitted from the luminescent layers. The region where the carrier re-combination occurs varies according to the thickness of the carrier re-combination control layer interposed between both luminescent layers. That is, the carriers may re-combine in either one of the luminescent layers, or in both layers, according to the thickness of the control layer. Thus, light of desired color. can be emitted from the luminescent panel by properly selecting the thickness of the control layer. It is confirmed that white light or arbitrary colored light can be emitted from the panel disclosed in the foregoing publication by properly controlling the thickness of the control layer and by mixing the different colored lights simultaneously emitted from the respective luminescent layers.

However, it is difficult to properly control the thickness of the carrier re-combination control layer in the manufacturing process, because it is considerably thin, e.g., 3 nm thick. If the thickness deviates from the target, desired colored light cannot be obtained. For example, when the thickness is too thin, only the electron transport luminescent layer emits light. On the other hand, when it is too thick, only the hole transport luminescent layer emits light. Therefore, white light resulting from mixing both colored lights may not be obtained even if it is desired.

SUMMARY OF THE INVENTION

The present invention has been made in view of the above-mentioned problem, and an object of the present invention is to provide an organic electroluminescent panel that is able to emit white light or arbitrary colored light without interposing the carrier re-combination control layer between the hole transport and the electron transport luminescent layers.

A hole transport luminescent layer and an electron transport luminescent layer are laminated so that both layers directly contact each other. Both luminescent layers are sandwiched between an anode and a cathode. The hole transport luminescent layer is positioned at a side of the anode, and the electron transport luminescent layer is positioned at a side of the cathode. The hole transport luminescent layer is composed of a hole transport host material and a first fluorescent material doped in the host material. Similarly the electron transport luminescent layer is composed of an electron transport host material and a second fluorescent material doped in the host material. Both luminescent layers simultaneously emit respective lights when a voltage is imposed on the pair of electrode layers. The lights emitted from both luminescent layers are mixed into a white light or any other colored light. The color of the mixed light is arbitrarily controlled by selecting combination of the host materials and the dopants.

In order to simultaneously emit light from both luminescent layers, combination of materials has to be properly chosen. If the material combination is improper, only one luminescent layer emits light while the other luminescent layer does not. For example, this occurs in the following material combination. The host material of the hole transport luminescent layer: α-naphthylphenylbenzen (α-NPD, emitting blue light), the first fluorescent material: perylene (emitting blue light), the host material of the electron transport luminescent layer: tris(8-quinolyl)aluminum (Alq, emitting green light), and the second fluorescent material: 4-(dicyanomethylene)-2-methyl-6-(p-dimethylaminostyryl)-4H-pyran (DCM1, emitting red light). In this example, DCM1 emits light but perylene does not, and the panel as a whole emits orange light.

This undesirable phenomenon occurs mostly for the following reasons. First, it is difficult for the carries (holes and electrons) to cross the boundary of both luminescent layers, because the energy levels (the minimum energy level in the conduction band or the maximum energy level in the valence band) are different to a large extent between both host materials. Accordingly, the chance of re-combination of the carries in both luminescent layers is small. In the particular example given above, holes can move from the hole transport luminescent layer to the electron transport luminescent layer, but movement of electrons in the reverse direction is difficult. Secondly, there is an energy gap difference between α-NPD (host material of the hole transport luminescent layer) and Alq (host material of the electron transport luminescent layer). The energy gap that is a difference between the conduction band minimum energy level and the valence band maximum energy level is peculiar to each material, and the energy gap of a material having a shorter luminescent wavelength is higher. The energy gaps of α-NPD and perylene are higher than that of Alq, while the energy gap of Alq is higher than that of DCM1. Therefore, the exciton energy generated in the electron transport luminescent layer does not move to the hole transport luminescent layer across the boundary, while it moves to the dopant DCM1. The exciton energy generated in the hole transport luminescent layer easily moves to the electron transport layer across the boundary.

Based on the consideration mentioned above, both host materials of the luminescent layers are selected so that their energy level difference becomes small and carriers can easily move across the boundary, and the combination of the host materials and the dopants is chosen so that the exciton energy becomes high and it moves beyond the boundary. More particularly, both host materials are selected so that their wavelength showing a solid state fluorescence spectrum peak commonly falls within a range of 380 nm–510 nm. It is preferable to use a material, the valence band maximum energy level of which is −5.6 eV or higher, as the host material of the hole transport luminescent layer, and to use a material, conduction band minimum energy level of which is −2.7 eV or lower, as the host material of the electron transport luminescent layer. The first and the second fluorescent materials to be doped in the host materials are selected so that their solid state fluorescence spectrum overlaps with that of the host materials or is shifted to the longer wavelength side. By selecting the materials as above, carriers can easily move across the boundary of both luminescent layers, and the fluorescent materials to be doped in the host materials can be chosen from a whole range of visible light. Both luminescent layers simultaneously emit respective lights that are mixed into a white light or any colored light desired. Further, electric energy is efficiently converted into light energy.

To further alleviate the energy barrier of the boundary of both luminescent layers, the fluorescent materials doped in the luminescent layers are selected, so that the conduction band minimum energy level of one of the fluorescent materials falls within a range between the conduction band minimum energy levels of both host materials, and the valence band maximum energy level of the other fluorescent material falls within a range between the valence band maximum energy levels of both host materials. The energy barrier of the boundary is determined by the conduction band minimum energy level difference (referred to as Dc) between both luminescent layers and the valence band maximum energy level difference (referred to a Dv) between both luminescent layers. Though those energy level differences are mostly determined by the host materials, they can be decreased by doping the fluorescent materials having energy levels as recited above. Thus, the carriers and excitons can move more easily across the boundary.

It is also preferable to make the difference between Dc and Dv smaller to further promote the movement of carriers, holes and electrons, in both direction. In the above example in which α-NPD is used as the host material of the hole transport luminescent layer and Alq as the host material of the electron transport luminescent layer, only holes are injected from the hole transport luminescent layer to the electron transport luminescent layer but the electrons do not move in the reverse direction. This undesirable phenomenon is caused for the following reasons. The conduction band minimum energy level of α-NPD is −2.4 eV and that of Alq is −3.0 eV, and accordingly Dc is 0.6 eV. The valence band maximum energy level of α-NPD is −5.4 eV and that of Alq is −5.7 eV, and accordingly Dv is 0.3 eV. Since Dc is larger than Dv in this example, only holes can be injected while electrons cannot.

It is found out that the carriers move in both directions if the difference between Dc and Dv is 0.2 eV or less. If Dc and Dv is substantially balanced, movement of electrons and holes are properly blocked by the boundary, and their re-combination occurs in both luminescent layers at the vicinity of the boundary. Accordingly, high energy conversion efficiency is realized.

Other objects and features of the present invention will become more readily apparent from a better understanding of the preferred embodiment and examples described below with reference to the following drawings.

BRIEF DESCRIPTION OF THE DRAWINGS

FIG. 7 is a chart showing energy levels of materials used in the luminescent layers;

DETAILED DESCRIPTION OF THE PREFERRED EMBODIMENT

A preferred embodiment of the present invention will be described with reference to the drawings. In the embodiment, a hole transport luminescent layer and a electron transport luminescent layer are directly laminated without interposing a carrier re-combination control layer. Both luminescent layers simultaneously emit respective colored lights which become a white light when both are mixed or combined.

Figure 1:
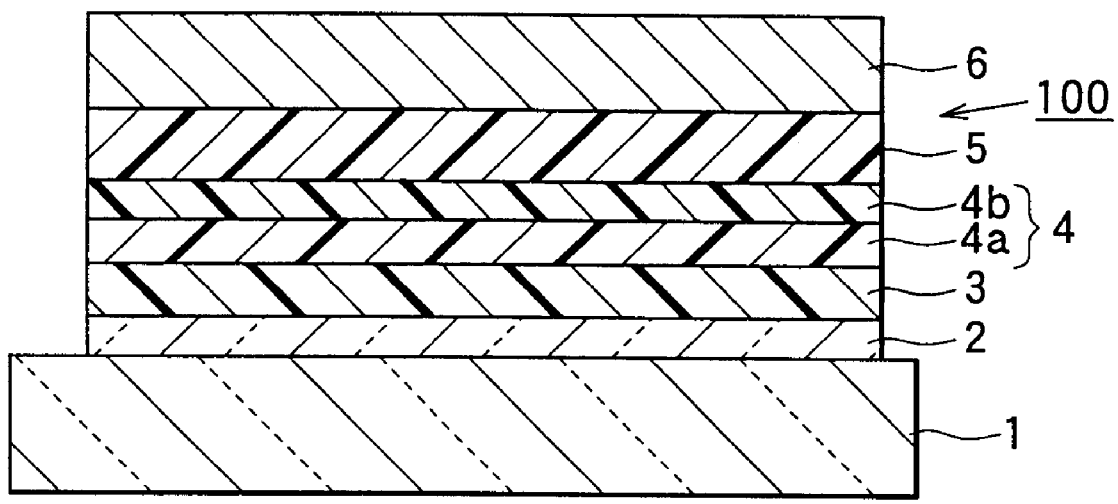
FIG. 1 is a schematic cross-sectional view showing an organic electroluminescent panel according to the present invention.
Figure 2:
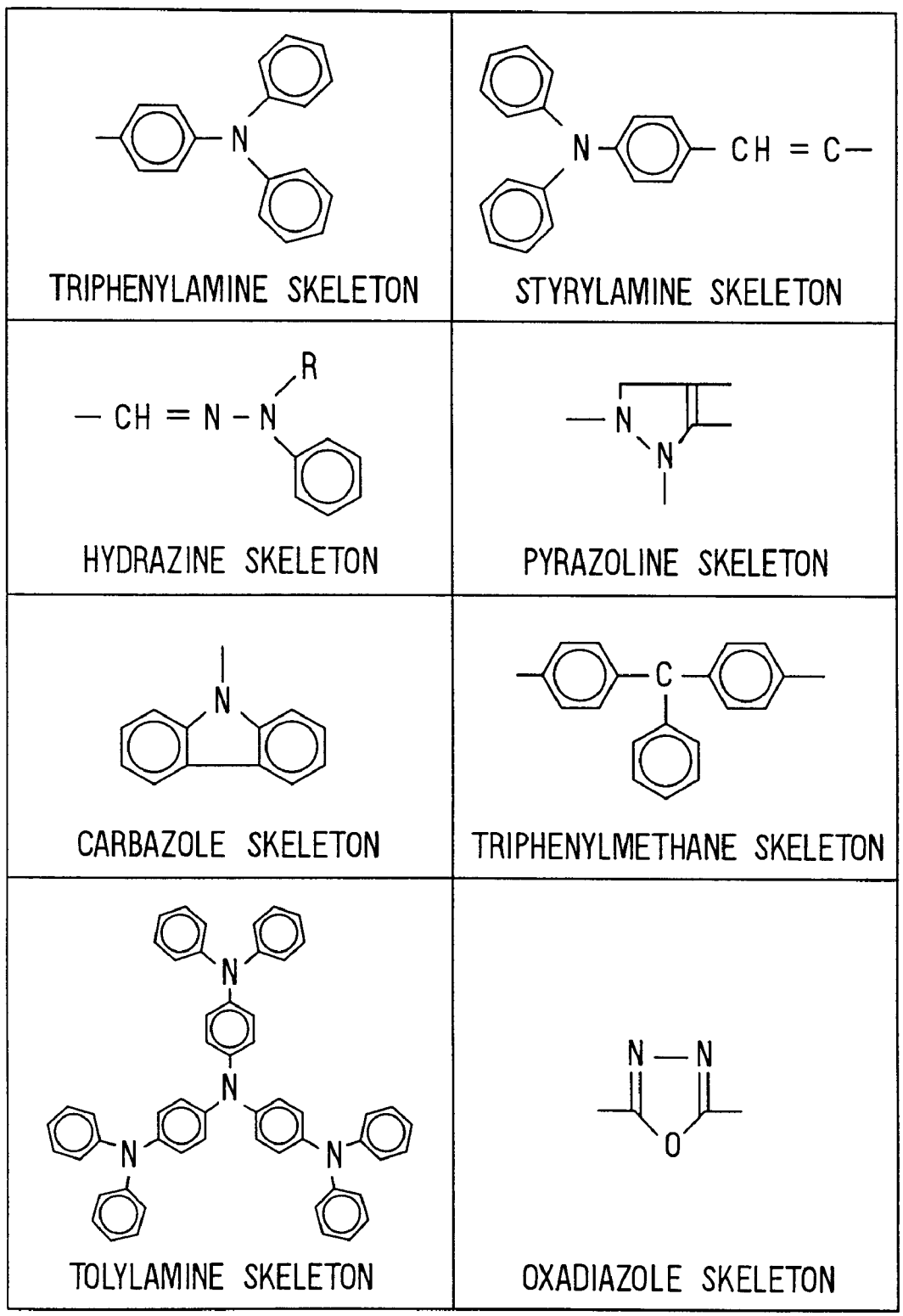
FIG. 2 is a drawing showing skeletons of some examples of organic compounds used in the electroluminescent panel.
Figure 3:
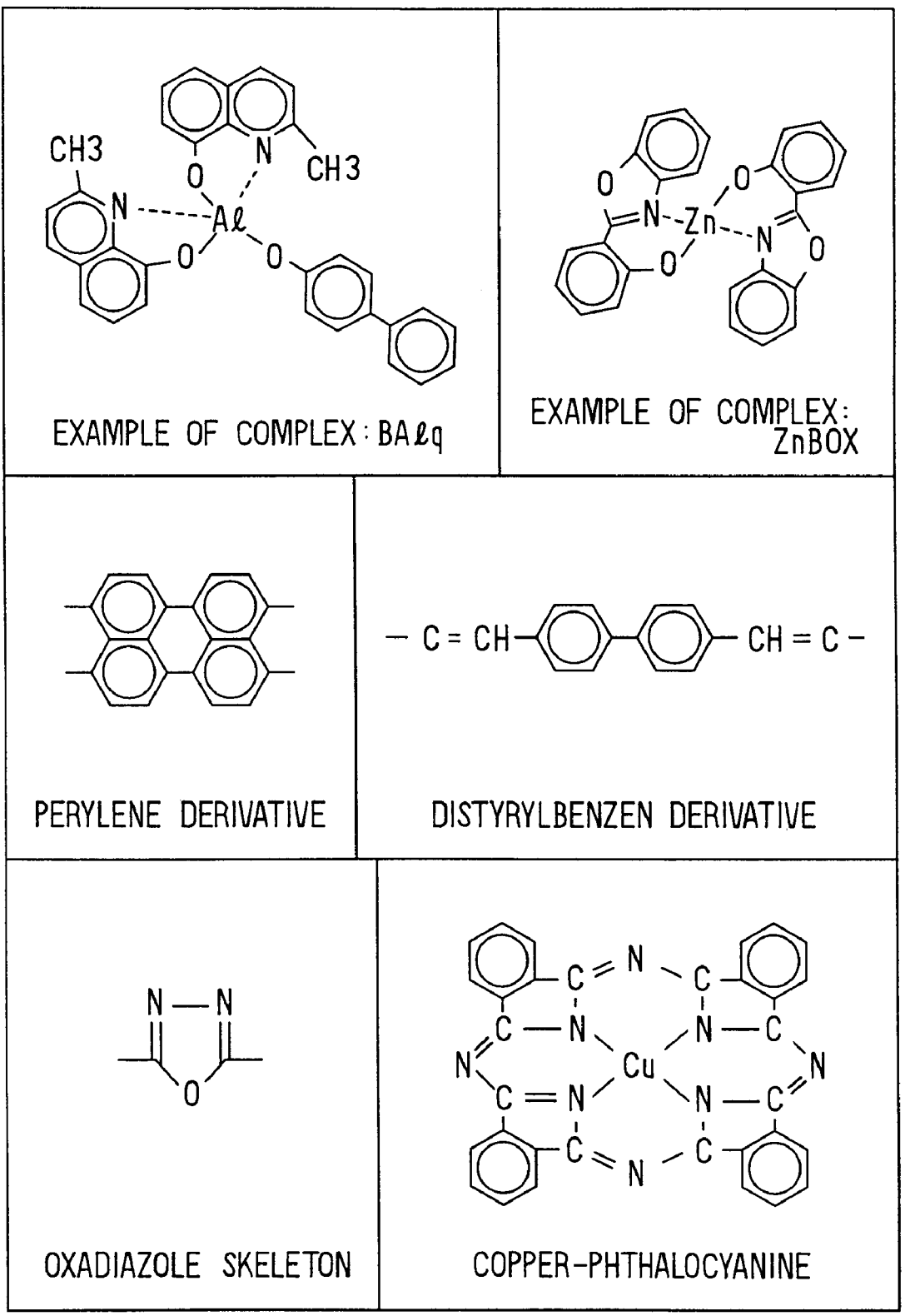
FIG. 3 is a drawing showing skeletons of other examples of organic compounds used in the electroluminescent panel.
Figure 4:
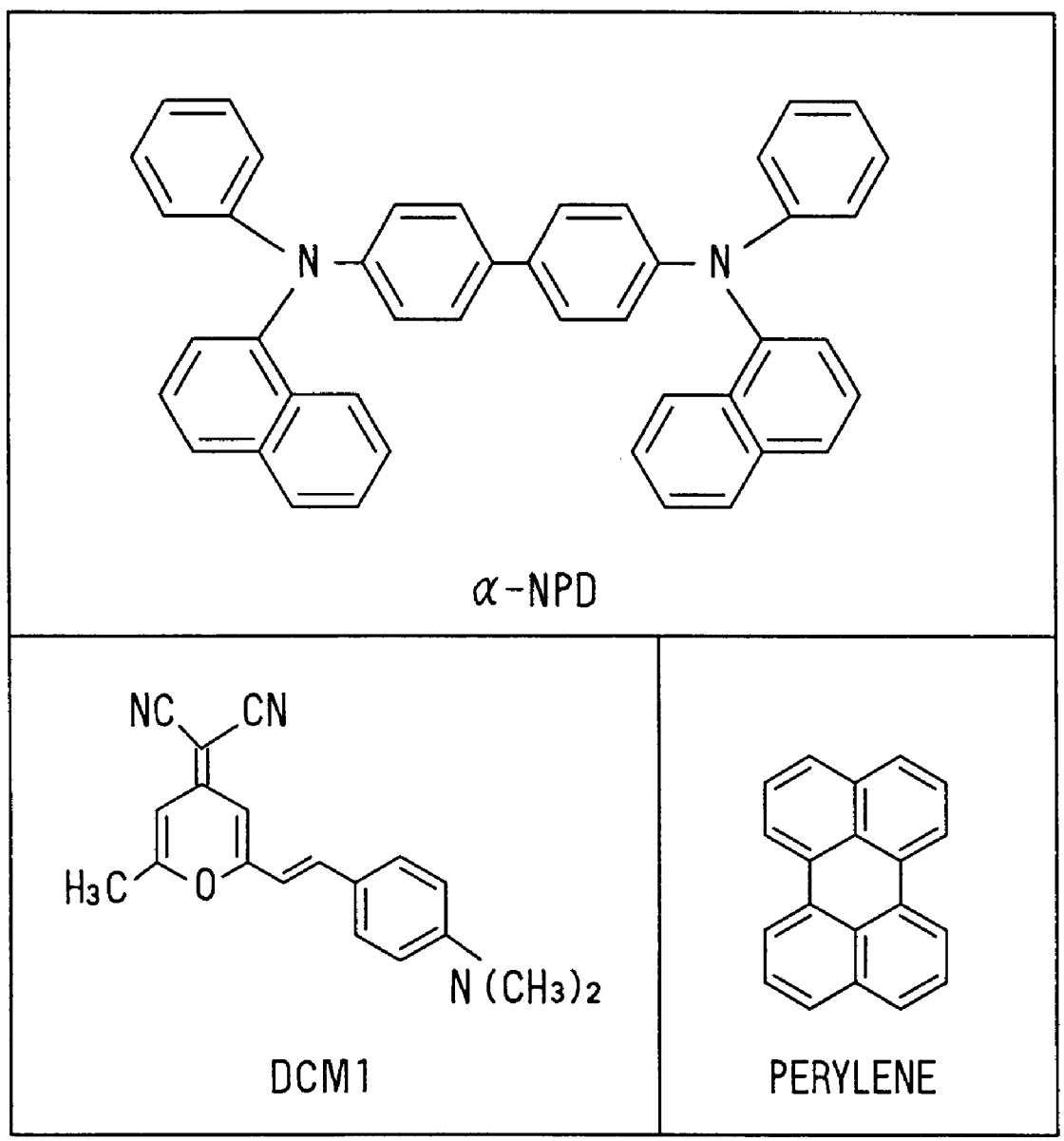
FIG. 4 is a drawing showing skeletons of further examples of organic compounds used in the electroluminescent panel.

First, referring to FIG. 1, the structure of the electroluminescent panel will be described. Though various materials used in this embodiment are known materials, the skeletons of typical materials are shown in FIGS. 2, 3 and 4. On a transparent substrate 1 such as a glass plate, an anode 2, a hole injection layer 3, a luminescent layer 4 including a hole transport luminescent layer 4a and an electron transport luminescent layer 4b, an electron injection layer 5, and a cathode 6 are all laminated in this order. The anode 2 is made of indium-tin-oxide (ITO), and its thickness is about 100 nm–1μm, preferably, 150 nm. The hole injection layer 3 can be made of any material that transports positive holes. For example, the materials having a diphenyl skeleton or skeletons shown in FIG. 2 may be used. The skeletons shown in FIG. 2 are: triphenylamine, styrylamine, hydrazine, pyrazoline, carbazole, triphenylmethane, tolylamine and oxadiazole skeletons. Also, a material having an aromatic diamine skeleton other than oxadiazole skeleton may be used.

Figure 5:
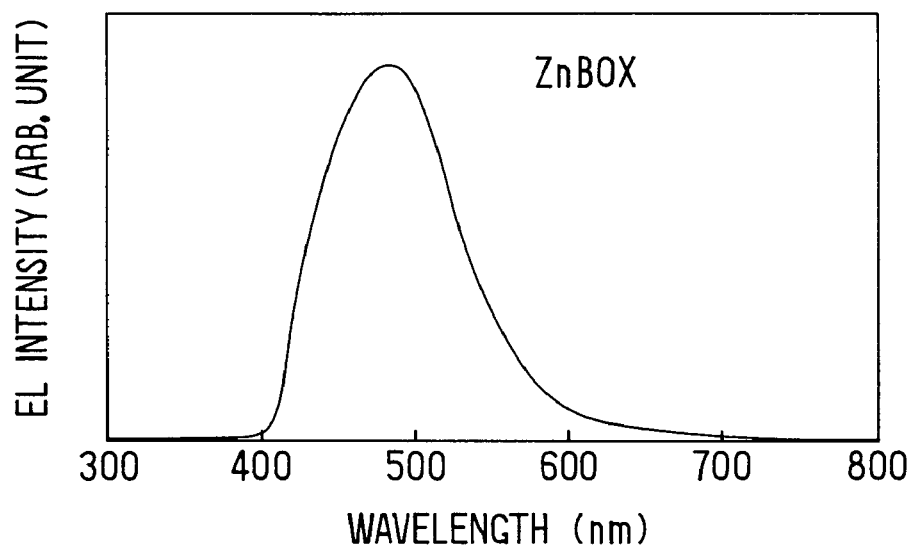
FIG. 5 is a graph showing a luminescence spectrum of benzooxadiazole-zinc-complex (ZnBOX).

The thickness of the luminescent layer 4 including the hole transport and the electron transport luminescent layers is about 10 nm–30 nm, preferably 20 nm. A host material of the hole transport luminescent layer 4a is made of a hole transport material that has a solid state fluorescence spectrum peak wavelength (referred to as SP-WL) of 380 nm–510 nm (blue color region) and has a maximum energy level in the valence band (hereinafter referred to as VB-ELmax) of −5.6 eV or higher. For example, a hole transport material having a triphenylamine skeleton (shown in FIG. 2) that shows blue fluorescence or an aromatic diamine derivative may be used. The solid state fluorescence spectrum peak wavelength (SP-WL) means the wavelength at which a material shows a fluorescence spectrum peak. The solid state fluorescence spectrum peak is not limited to a clear peak like a line spectrum, but it may be a peak having a certain width like a band spectrum as shown in FIG. 5.

A host material of the electron transport luminescent layer 4b is an electron transport material that has the same SP-WL as the host material of the hole transport luminescent layer 4a and has a minimum energy level in the conduction band (hereinafter referred to as CB-ELmin) of −2.7 eV or lower. For example, a metal-complex such as benzooxadiazole-zinc-complex (ZnB OX), a distyrylbenzen derivative or a material having an oxadiazole skeleton, all shown in FIG. 3, or a spiro-compound may be used.

A respective fluorescent material is doped as a dopant in each luminescent layer 4a, 4b. As the fluorescent material to be doped in the hole transport luminescent layer 4a, a material that shows fluorescence color that is different from that of the fluorescent material to be doped in the electron transport luminescent layer 4b is used. Also, as both fluorescent dopant materials, materials showing a solid state fluorescence spectrum that overlaps the solid state fluorescence spectrum of both host materials or that is shifted to the longer wavelength side are selected.

Figure 6:
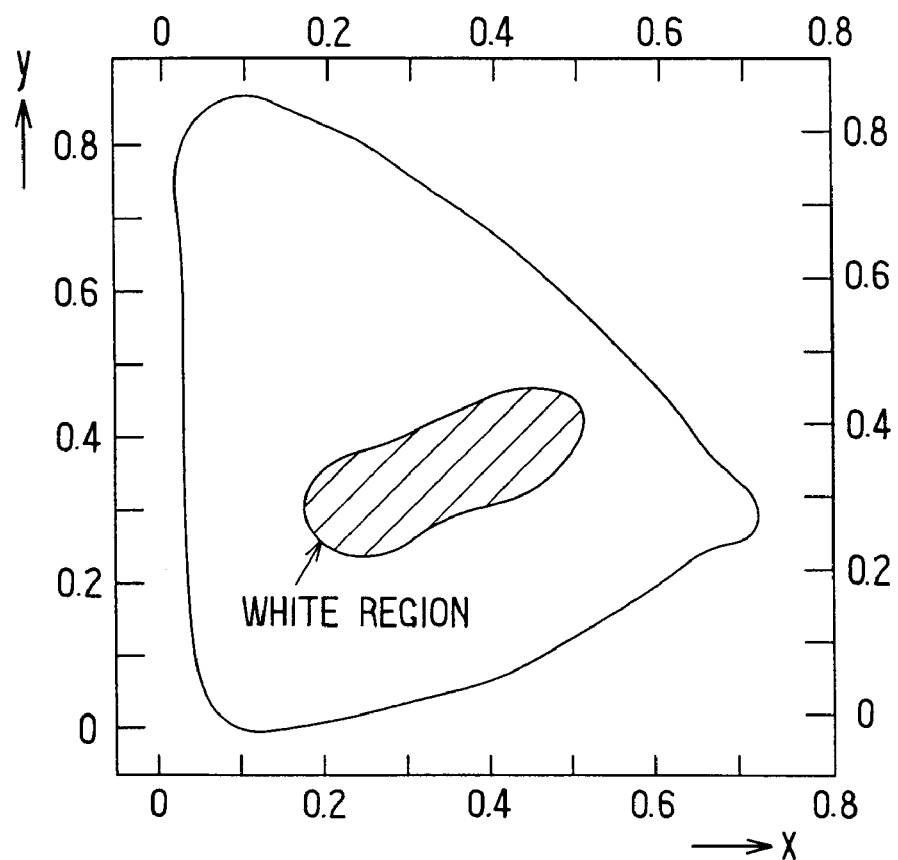
FIG. 6 is a chromaticity diagram showing a region of white light.

In this particular embodiment, the panel is designed, so that blue light is emitted from the hole transport luminescent layer 4a, and orange group light (green, orange and red) is emitted from the electron transport luminescent layer 4b. The lights emitted form the both luminescent layers 4a, 4b are mixed to obtain white light having chromaticity as shown in FIG. 6 (hatched region). For this purpose, the following fluorescent dopant materials are selected. As the fluorescent material to be doped in the hole transport luminescent layer 4a (the first fluorescent material), a material having SP-WL of 380 nm–510 nm (blue light region) is used. More particularly, perylene (shown in FIG. 4), tetraphenylbutadiene (TPB) or the like is used. As the fluorescent material to be doped in the electron transport luminescent layer 4b (the second fluorescent material), a material having SP-WL of 480 nm–700 nm (orange group light region) is used. More particularly, 4-dicyanomethylene)-2-methyl-6-(p-dimethylaminostyryl)-4H-pyran (DCM1, shown in FIG. 4), Nile Red, europium-complex or the like is used.

The electron injection layer 5 laminated on the electron transport luminescent layer 4b is about 10 nm–100 nm thick, preferably 50 nm thick. The material for this layer 5 may be variously chosen from electron transport materials, for example, from materials belonging to metal-complex, materials having oxadiazole skeleton, perylene derivatives, distyrylbenzen derivatives, or the like. The cathode 6 formed on the electron injection layer 5 is about 100 nm–1 μm thick. It may be formed in a double layer structure by LiF/Al or LiO/Al, or may be made from a metallic material mixture of Mg and Al, or Al and Li.

The electroluminescent panel 100 is structured as described above. To effectively inject positive holes from the anode 2 to the hole injection layer 3, it is preferable that the CB-ELmin of the hole injection layer 3 is close to an ionization potential of the anode 2. For this purpose, the ionization potential of the anode 2 may be modified by cleansing the surface thereof with ultraviolet. It is also possible to divide the hole injection layer 3 into two or more layers and to place a layer having the CB-ELmin closer to the anode 2 in contact with the anode 2. As the layer contacting the anode 2, it is preferable to use a material having a tolylamine skeleton (shown in FIG. 2), copper-phthalocyanine (shown in FIG. 3) or the like. In order to improve electron injection efficiency from the cathode 6 to the electron injection layer 5, the electron injection layer 5 may be divided into two or more layers, and a layer having a higher electron transport ability is placed in contact with the cathode 6. Preferably, the layer contacting the cathode 6 is made of aluminum-quinolinol-complex or the like. It is also possible to use the same material both for the host material of the hole transport luminescent layer 4a and for the hole injection layer 3. Similarly, the same material may be used both for the host material of the electron transport luminescent layer 4b and for the electron injection layer 5.

The electroluminescent panel 100 described above can be manufactured by known processes such as vapor deposition or sputtering. All the layers, the anode 2, the hole injection layer 3, the hole transport luminescent layer 4a, the electron transport luminescent layer 4b, the electron injection layer 5 and the cathode 6 are formed on the transparent substrate 1 in this order. The hole transport luminescent layer 4a that includes the host material and the first fluorescent material doped therein may be formed by depositing the host material and the dopant together. The electron transport luminescent layer 4b that includes the host material and the second luminescent material doped therein may be formed in the similar manner.

The electroluminescent panel 100 is driven by imposing voltage, for example, of several to several-tens volts, between a pair of electrode layers 2, 6. By imposing the voltage, holes are injected from the anode 2 to the hole transport luminescent layer 4a through the hole injection layer 3, and electrons are injected from the cathode 6 to the electron transport luminescent layer 4b through the electron injection layer 5. The injected carriers (holes and electrons) are transported into both luminescent layers 4a, 4b across the boundary between both luminescent layers, because the host materials in both luminescent layers 4a, 4b are selected so that they have the SP-WL in the common range of 380 nm–510 nm, and therefore, the energy level difference between both luminescent layers 4a, 4b is small. The carries moved across the boundary re-combines, generating excitons.

The solid state fluorescent spectrum of the fluorescent material doped in respective luminescent layer 4a, 4b overlaps with the solid state fluorescent spectrum of the host material or is shifted to its longer wavelength side, as explained above, and accordingly, the energy gap of the respective host material is substantially equal to, or higher than that of the respective dopant. Therefore, the energy of the excitons, the level of which is dependent on the host material, moves to the fluorescent dopant material which has energy that is equal to or lower than that of the excitons. The energy of excitons moves either to the fluorescent material of the luminescent layer where the excitons are located or to the fluorescent material of the other luminescent layer across the boundary. Both fluorescent materials doped in respective luminescent layers 4a, 4b receive energy from the excitons and simultaneously emit lights having respective spectra.

That is, blue light is emitted from the fluorescent material in the hole transport luminescent layer 4a, and orange region light is emitted from the fluorescent material in the electron transport luminescent layer 4b. The electroluminescent panel 100, as a whole, emits white light, combining both lights emitted from both luminescent layers 4a, 4b. The light emission from the panel occurs when plus voltage is imposed on the anode 2 and minus voltage is imposed on the cathode 6. In actual operation, reverse voltage is also imposed on the pair of the electrodes to alleviate charge accumulation in the panel. However, no light is emitted when the reverse voltage is applied.

In the particular embodiment described above, fluorescent materials are selected so that the electroluminescent panel as a whole emits white light. It is possible to emit any colored light selected from a whole range of visible light by properly selecting fluorescent materials.

Referring to FIG. 7, relation among energy levels of host materials and dopants in both luminescent layers 4a, 4b will be explained. In FIG. 7, line C denotes the boundary of both luminescent layers 4a and 4b. Lines A4a and B4a show the minimum energy level in the conduction band (CB-ELmin) and the maximum energy level in the valence band (VB-ELmax) of the hole transport material, respectively. Lines A4b and B4b show the CB-ELmin and VB-ELmax of the electron transport material, respectively. A4 denotes a difference between A4a and A4b, and B4 denotes a difference between B4a and B4b. D1, D2 and D3 show the CB-ELmin of the fluorescent material, respectively. E1, E2 and E3 show the VB-ELmax of the fluorescent material, respectively.

According to the present invention, the host and dopant materials are selected, so that the CB-Elmin of one of the dopants (D1) is positioned in the range of A4, and VB-ELmax of the other dopant (E1) is positioned in the range of B4. Alternatively, the CB-ELmin of one of the dopants (D2) is positioned in the range of A4, and CB-ELmax of the other dopant (E2) is positioned outside the range of B4 (though E2 is shown above the range B4 in FIG. 7, it may be positioned below the range B4). Alternatively, the CB-ELmin of one of the dopants (D3) may be positioned outside the range A4 (either above or below), and the VB-ELmax of the other dopant (E3) may be positioned in the Range B4.

By selecting the energy level relations as above, the energy barrier of the boundary of both luminescent layers 4a and 4b can be alleviated. The energy barrier corresponds to the energy level difference A4 and the energy level differences B4. Because the energy barrier is this alleviated, movement of carriers and exciton energy across the boundary is enhanced, and accumulation of carriers around the boundary is suppressed. Accordingly, the electroluminescent panel emits light more effectively and its brightness is improved. As an example, the following materials may be selected: α-naphthylphenylbenzen (α-NPD shown in FIG. 4) having CB-BLmin of −2.4 eV and VB-ELmax of −5.4 eV as the hole transport material; benzooxadiazole-zinc-complex (ZnBOX shown in FIG. 3) having CB-ELmin of −2.9 eV and VB-ELmax of −5.8 eV as the electron transport material; perylene (shown in FIG. 4) having CB-ELmin of −2.75 eV and VB-ELmax of −5.5 eV as the fluorescent material doped in either one of the hole or electron transport material.

It is preferable to dope the fluorescent material in host materials of the luminescent layers 4a, 4b in a ratio of 0.1 wt %–10 wt %. If the percentage of the dopant exceeds 10 wt %, so-called luminance-disappearance occurs. That is, molecules of the fluorescent material meet and closely contact one another, and the exciton energy is exchanged among the molecules. As a result, the energy cannot be used for emitting light. On the contrary, if the dopant percentage is lower than 0.1 wt %, light is emitted also from the host materials and is mixed with the light emitted from the dopants. As a result, the light color cannot be controlled solely by the fluorescent materials doped in both luminescent layers 4a, 4b. It is not desirable that the light emitted from the host materials becomes predominant, because the light color of the electroluminescent panel cannot be arbitrarily controlled anymore by selecting the lumine scent dopant materials. Moreover, high luminance cannot be obtained if the dopant percentage is too low, because energy-light conversion efficiency of the host material is lower than that of the dopant.

The embodiment described above may be variously modified. The fluorescent materials doped in the hole transport luminescent layer 4a and the electron transport luminescent layer 4b may be exchanged. For example, in the electroluminescent panel for emitting white light, the fluorescent material having the SP-WL of 480 nm–700 nm may be doped in the hole transport material having the SP-WL of 380 nm −510 nm, and the fluorescent material having the SP-WL of 380 nm–510 nm may be doped in the electron transport material having the SP-WL of 380 nm–510 nm.

Two or more kinks of the fluorescent materials may be doped in each luminescent layers 4a, 4b, as long as the SP-WLs of the host material and the dopant satisfies the above-mentioned relation. In the case two or more kinds of the fluorescent materials are doped in a luminescent layer 4a or 4b, the dopant concentration combining all the dopants is set in a range of 0.1 wt %–10 wt %. For example, in the electroluminescent panel for emitting white light, two or more kinds of the fluorescent materials may be doped in the electron transport luminescent layer 4b. Further, each luminescent layer 4a, 4b may be divided into two or more layers each including respective dopants.

Figure 8A:
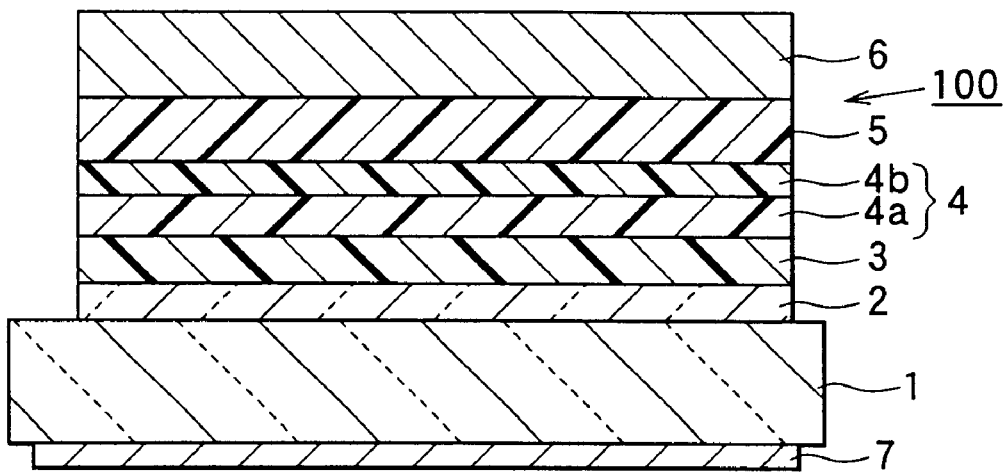
FIG. 8A is a schematic cross-sectional view showing a modified form of the electroluminescent panel shown in FIG. 1.
Figure 8B:
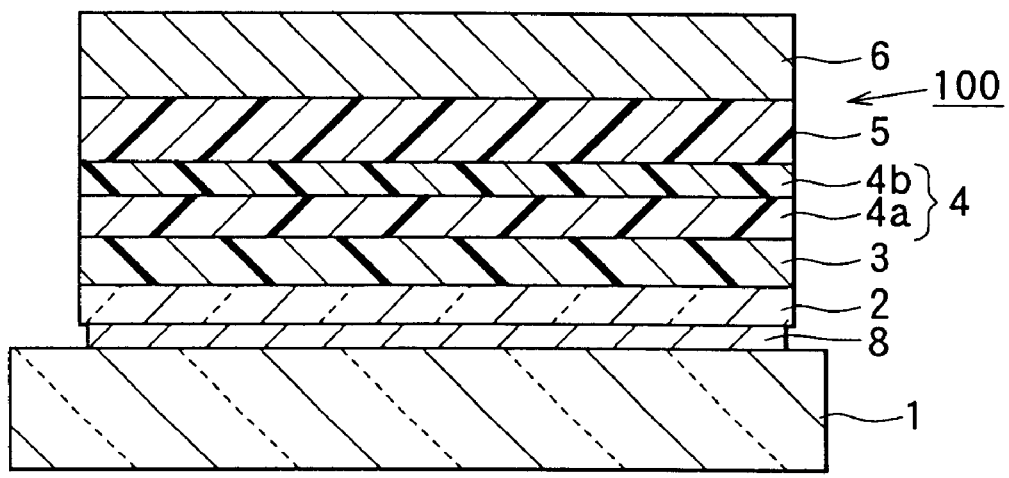
FIG. 8B is a schematic cross-sectional view showing another modified form of the electroluminescent panel shown in FIG. 1.

The structure of the electroluminescent panel may be modified as shown in FIGS. 8A and 8B. In FIG. 8A, a polarizing filter 7 is attached to the transparent substrate 1, so that outside light entering from the substrate 1 (from the viewer side) into the panel is not reflected on the cathode 6. Thus, the contrast of the panel is increased, and the quality of images displayed on the panel is improved. As shown in FIG. 8B, a layer for converting light color, such as a color filter 8, may be disposed between the anode 2 and the substrate 1, so that multi-color images can be displayed on the panel.

As described above, both luminescent layers 4a and 4b directly contact each other without interposing the carrier re-combination control layer therebetween, and each luminescent layer emits respective light, the color of which is independently controllable by selecting dopants and/or their thickness. Therefore, the panel as a whole can emit white light or arbitrary colored light by mixing the lights emitted from the both luminescent layers 4a, 4b. Further, electric energy can be efficiently converted into light. Some specific examples according to the present invention will be shown below in detail.

EXAMPLE 1

The following layers are laminated on the transparent substrate 1.

Anode 2: ITO, 150 nm thick;

Hole injection layer 3: α-NPD (CB-ELmin=−2.4 eV, VB-ELmax=−5.4 eV, SP-WL=400 nm–500 nm), 20 nm thick;

Host material of hole transport luminescent layer 4a: α-NPD, 20 nm thick;

Fluorescent material doped in 4a: perylene (CB-ELmin=−2.75 eV, VB-ELmax=−5.5 eV, SP-WL=450 nm–460 nm), 1.0 wt %, 20 nm thick;

Host material of electron transport luminescent layer 4b: ZnBOX (CB-ELmin=−2.9 eV, VB-ELmax=−5.8 eV, SP-WL=400 nm–480 nm), 5 nm thick;

Fluorescent material doped in 4b: DCM1(CB-ELmin=−3.5 eV, VB-ELmax =−5.4 eV, SP-WL=570 nm–610 nm), 0.25 wt %; and Electron injection layer 5: ZnBOX, 50 nm thick.

Figure 9:
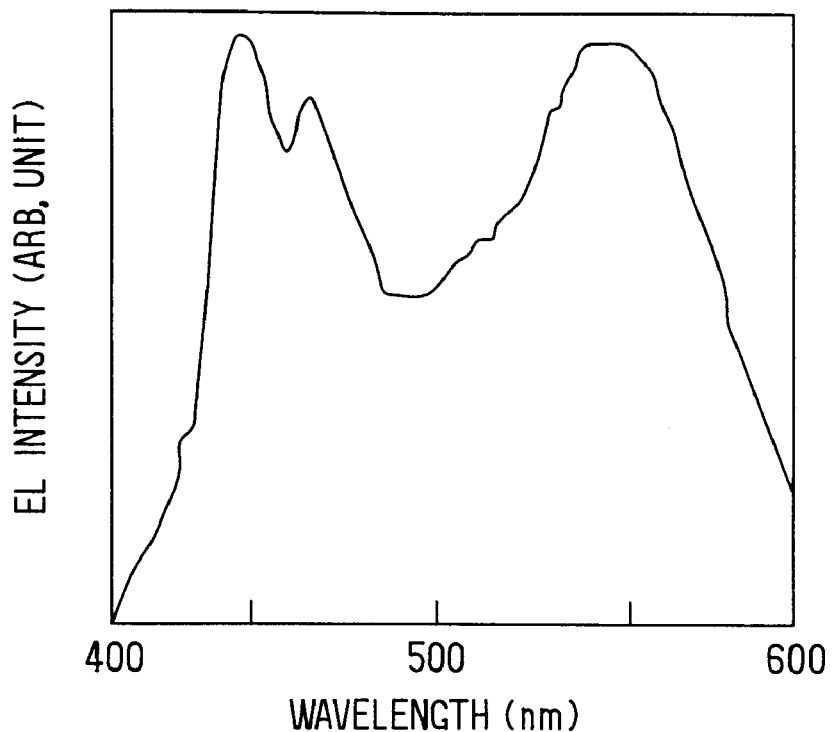
FIG. 9 is a graph showing a luminescence spectrum of Example 1 of the present invention.

The luminescence spectrum of Example 1 is shown in FIG. 9, in which two luminescence peaks are seen, one is a 450 nm peak by perylene doped in the hole transport luminescent layer 4a, and the other is a 580 nm peak by DCM1doped in the electron transport luminescent layer 4b. Both lights are simultaneously emitted and mixed into white light having chromaticity coordinates of (0.320, 0.350). The brightness of 10,000 cd/m² is obtained by imposing 12 volts on the panel.

EXAMPLE 2

In this example, the fluorescent materials doped in both luminescent layers 4a, 4b are exchanged. That is, 0.25 wt % of DCM1is doped in the hole transport luminescent layer 4a, and 1.0 wt % of perylene is doped in the electron transport luminescent layer 4b. Other structures and materials are the same as those of Example 1. 450 nm luminance by perylene and 550 nm luminance by DCM1are mixed into a white light having a brightness as high as that of Example 1.

EXAMPLE 3

This example is the same as Example 1, except that two fluorescent materials are doped in the electron transport luminescent layer 4b.

One dopant: coumarin-6 (CB-ELmin=−3.2 eV, VB-ELmax=−3.2 eV), 0.2 wt %; and

The other dopant: Nile Red (CB-ELmin=−3.5 eV, VB-ELmax=−5.4 eV, SP-WL=600 nm–650 nm), 0.1 wt %.

Light having the SP-WL of 450 nm is emitted from perylene in the layer 4a, light having the SP-WL of 530 nm from coumarin-6 in the layer 4b, and light having the SP-WL of 620 nm from Nile Red in the layer 4b. Those three colored lights are simultaneously emitted and mixed into a white light. By increasing the kinds of fluorescent materials doped in the luminescent layers, the chromaticity of the mixed light can be finely tuned. Since the white light obtained in this particular example is a mixture of three color components, red, green and blue, brightness of respective color components can be properly displayed when the mixed light is emitted through the color filter 8 shown in FIG. 8B. For the same reason, this mixed white light is advantageous when it is used as a back light of a display panel having a color filter.

EXAMPLE 4

Figure 10:
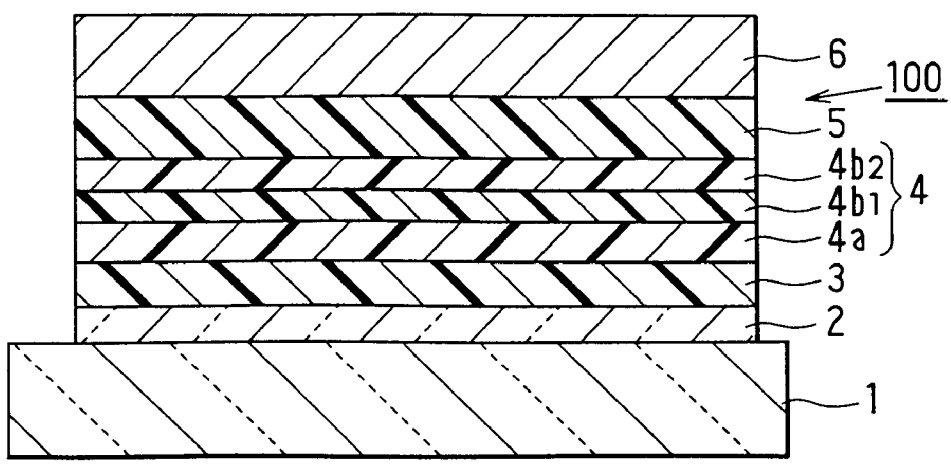
FIG. 10 is a schematic cross-sectional view showing Example 4 of the present invention.

In this example, the electron transport luminescent layer 4b is divided into two layers, 4b1 and 4b2, as shown in FIG. 10. Different fluorescent materials are doped in the layers 4b 1 and 4b 2, respectively. Details of each layer are as follows.

Figure 11:
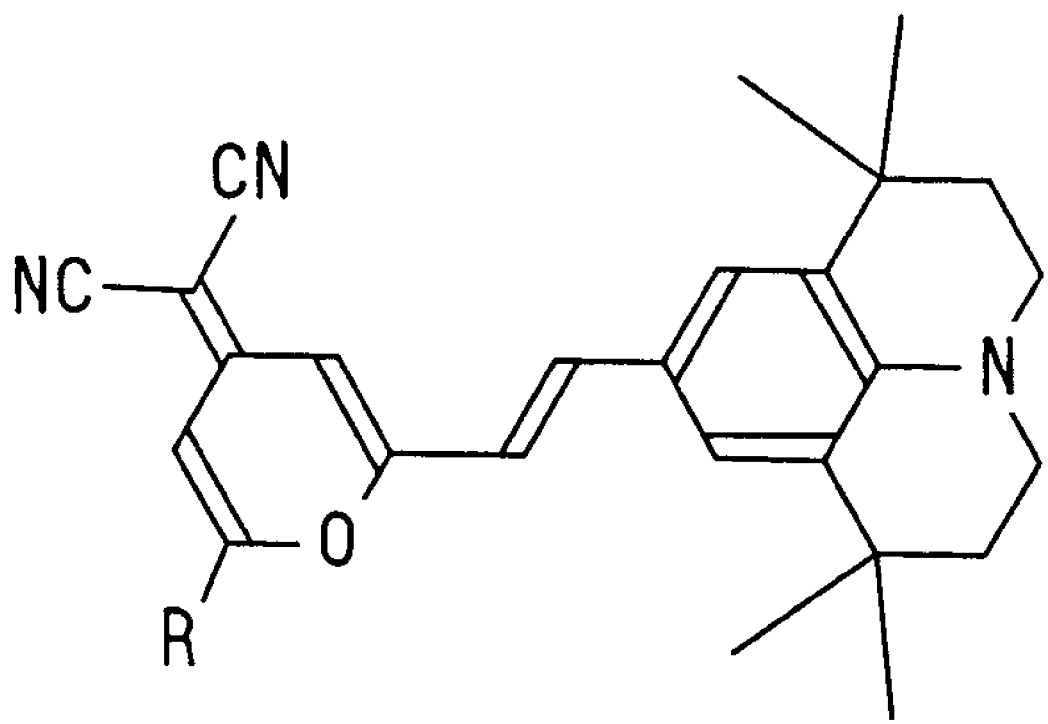
FIG. 11 is a drawing showing a skeleton of a fluorescent material DCJTB.

Anode 2: ITO;

Hole injection layer 3: copper-phthalocyanine (shown in FIG. 3, CB-ELmin=−3.6 eV, VB-ELmax=−5.3 eV);

Hole transport luminescent layer 4a: α-NPD doped with 1.5 wt % perylene, 20 nm thick;

Electron transport luminescent layer 4b: divided into low layers 4b 1 and 4b 2 as shown in FIG. 10;

Layer 4b 1: BAlq (shown in FIG. 3, CB-ELmin=−3.0 eV, VB-ELmax=−6.0 eV) doped with 0.5 wt % dimethylquinacridon showing green fluorescence, 10 nm thick;

Layer 4b 2: BAlq doped with 0.5 wt % DCJTB (shown in FIG. 11) showing red fluorescence, 10 nm thick;

Electron injection layer 5: tris(8-quinolyl)aluminum-complex (abbreviated as Alq, CB-ELmin=−3.1 ev, VB-ELmax=−5.6 eV); and Cathode 6: LiF/Al.

Since BAlq is used as the host material of the divided luminescent layers 4b 1 and 4b 2 in this example, a variety of fluorescent materials can be selected from a whole rang of visible light. Three luminescent lights of blue, green and red are mixed into a bright white light having chromaticity coordinates of (0.30, 0.350).

EXAMPLE 5

This example is the same as Example 1, except that the fluorescent material DCM1doped in the electron transport luminescent layer 4b is replaced with perylene. That is, the hole transport luminescent layer 4a is composed of the host material α-NPD and the dopant perylene, and electron transport luminescent layer 4b is composed of the host material ZnBOX and the same dopant perylene. 1.0 wt % of perylene is doped in the layer 4b in this particular example. The thickness of the layer 4b is about 40 nm, and that of the electron injection layer 5 is about 20 nm. Since both luminescent layers 4a, 4b emit the same blue light having the SP-WL of 450 nm, the mixed light emitted from the panel is a pure blue light having chromaticity coordinates of (0.180, 0.270). A luminance of 5,000 cd/m² is obtained by imposing 10 volts on the panel.

In Examples 1 and 2, the fluorescent material DCM1that is doped in the luminescent layer 4b or 4a may be replaced with quinacridon without changing the host materials of both luminescent layers 4a, 4b. In this case, light blue is realized as a mixed color of perylene and quinacridon. Further, yellow is realized when quinacridon and DCM1are used as fluorescent materials. By combining various fluorescent materials, other arbitrary colors in the visible light range, such as purple, yellow-green, pink, etc. can be realized. It also possible to let the host materials themselves emit light by so selecting the thickness of the luminescent layers and the concentration of the dopants.

While the present invention has been shown and described with reference to the foregoing preferred embodiment and examples, it will be apparent to those skilled in the art that changes in form and detail may be made therein without departing from the scope of the invention as defined in the appended claims.

What is claimed is:

1. An organic electroluminescent panel comprising:
   an anode;
   a cathode; and
   a luminescent layer interposed between the anode and the cathode, the luminescent layer including
      a hole transport luminescent layer positioned at an anode side and
      an electron transport luminescent layer positioned at a cathode side, both the hole transport and the electron transport luminescent layers directly contacting each other;

the hole transport luminescent layer comprising hole transport host material and a first fluorescent material doped in the hole transport host material, the hole transport host material having a solid state fluorescent peak in a wavelength range of 380 nm to 510 nm;

the electron transport luminescent layer comprising an electron transport host material and a second fluorescent material doped in the electron transport host material, the electron transport host material having a solid state fluorescent peak in a wavelength range of 380 nm to 510 nm;

a solid state fluorescent spectrum of each of the first and second fluorescent materials either overlaps the solid state fluorescent spectrums of both host materials or is positioned at a longer wavelength side thereof; and wherein a difference between a minimum energy level difference in a conduction band between the hole transport host material and the electron transport host material and a maximum energy level difference in a valence band between the hole transport host material and the electron transport host material is less than 0.2 eV.

2. The organic electroluminescent panel as in claim 1, wherein:

a minimum energy level in a conduction band of one of the first and second fluorescent materials is between a minimum energy level in a conduction band of the hole transport host material and a minimum energy level in a conduction band of the electron transport host material; and a maximum energy level in a valence band of the other fluorescent material is between a maximum energy level in a valence band of the hole transport host material and a maximum energy level in a valence band of the electron transport host material.

3. The organic electroluminescent panel as in claim 1, further comprising:

a hole injection layer disposed between the hole transport luminescent layer and the anode; and an electron injection layer disposed between the electron transport luminescent layer and the cathode.

4. The organic electroluminescent panel as in claim 1, wherein:

the hole transport host material is α-NPD;

the first fluorescent material is perylene;

the electron transport host material is a ZnBOX; and the second fluorescent material is DCM1.

5. The organic electroluminescent panel as in claim 1, wherein:

the hole transport host material is α-NPD;

the first fluorescent material is DCM1;

the electron transport host material is a ZnBOX; and the second fluorescent material is perylene.

6. The organic electroluminescent panel as in claim 1, wherein:

the hole transport host material is α-NPD;

the first fluorescent material is perylene;

the electron transport host material is a ZnBOX; and the second fluorescent material includes coumarin-6 and Nile Red.

7. The organic electroluminescent panel as in claim 1, wherein:

the hole transport host material is α-NPD;

the first fluorescent material is perylene;

the electron transport luminescent layer is divided into two layers, a first layer and a second layer;

the electron transport host material is BAlq; and the second fluorescent material includes dimethylquinacridon doped in the first layer and DCJTB doped in the second layer.

8. The organic electroluminescent panel as in claim 1, wherein:

the hole transport host material is α-NPD;

the electron transport host material is a ZnBOX; and both the first and second fluorescent materials are perylene.

* * * * *